(12) United States Patent
Uppal et al.

(10) Patent No.: US 10,600,699 B2
(45) Date of Patent: Mar. 24, 2020

(54) APPARATUS FOR INSPECTION OF A PACKAGE ASSEMBLY WITH A THERMAL SOLUTION

(71) Applicant: Intel Corporation, Santa Clara, CA (US)

(72) Inventors: Aastha Uppal, Chandler, AZ (US); Je-Young Chang, Phoenix, AZ (US); Shankar Devasenathipathy, Tempe, AZ (US); Joseph B. Petrini, Gilbert, AZ (US)

(73) Assignee: Intel Corporation, Santa Clara, CA (US)

(*) Notice: Subject to any disclaimer, the term of this patent is extended or adjusted under 35 U.S.C. 154(b) by 244 days.

(21) Appl. No.: 15/685,772

(22) Filed: Aug. 24, 2017

(65) Prior Publication Data

US 2019/0067135 A1 Feb. 28, 2019

(51) Int. Cl.
| | | |
|---|---|---|
| *H01L 21/66* | (2006.01) | |
| *G01K 7/22* | (2006.01) | |
| *H01L 23/498* | (2006.01) | |
| *G01K 1/02* | (2006.01) | |
| *G01K 1/14* | (2006.01) | |
| *H01L 23/427* | (2006.01) | |

(52) U.S. Cl.
CPC .............. *H01L 22/34* (2013.01); *G01K 1/026* (2013.01); *G01K 1/14* (2013.01); *G01K 7/226* (2013.01); *H01L 22/12* (2013.01); *H01L 23/49816* (2013.01); *H01L 23/427* (2013.01)

(58) Field of Classification Search
CPC ........ G01N 25/18; G01N 25/20; G01K 17/00; G01K 7/015

USPC .... 374/29, 30, 178, 141, 143, 45, 46, 57, 4, 374/5, 165, 166
See application file for complete search history.

(56) References Cited

U.S. PATENT DOCUMENTS

| | | | | |
|---|---|---|---|---|
| 4,999,509 A | * | 3/1991 | Wada | ................. G01B 11/0625 250/559.27 |
| 6,911,836 B2 | * | 6/2005 | Cannon | .............. G01R 31/2891 324/750.08 |

(Continued)

FOREIGN PATENT DOCUMENTS

| | | | |
|---|---|---|---|
| CN | 102768225 B | * | 4/2014 |
| JP | 02010210545 A | * | 8/2018 |

*Primary Examiner* — Gail Kaplan Verbitsky
(74) *Attorney, Agent, or Firm* — Schwabe, Williamson & Wyatt, P.C.

(57) ABSTRACT

Embodiments of the present disclosure provide techniques and configurations for inspection of a package assembly with a thermal solution, in accordance with some embodiments. In embodiments, an apparatus for inspection of a package assembly with a thermal solution may include a first fixture to house the package assembly on the apparatus, and a second fixture to house at least a portion of a thermal solution that is to be disposed on top of the package assembly. The apparatus may further include a load actuator, to apply a load to a die of the package assembly, via the thermal solution, and a plurality of sensors disposed around the thermal solution and the package assembly, to perform in situ thermal and/or mechanical measurements associated with the application of the load to the die of the package assembly. Other embodiments may be described and/or claimed.

17 Claims, 6 Drawing Sheets

(56) References Cited

U.S. PATENT DOCUMENTS

| | | | | |
|---|---|---|---|---|
| 7,415,379 | B2* | 8/2008 | Powell | G01R 31/2822 340/426.36 |
| 8,471,575 | B2* | 6/2013 | Fregeau | G01R 31/2874 324/750.03 |
| 2001/0005817 | A1* | 6/2001 | Caggiano | G01R 31/2805 702/117 |
| 2005/0040838 | A1* | 2/2005 | Cannon | G01R 31/2891 324/750.08 |
| 2006/0014309 | A1* | 1/2006 | Sachdev | G01R 1/0466 438/17 |
| 2008/0163631 | A1* | 7/2008 | Campbell | G06F 1/20 62/175 |
| 2010/0131236 | A1* | 5/2010 | Lafleur | G01N 3/20 702/158 |
| 2010/0164510 | A1* | 7/2010 | Abazarnia | G01R 31/2874 324/555 |
| 2012/0197583 | A1* | 8/2012 | Liang | G01R 31/2801 702/125 |
| 2018/0144963 | A1* | 5/2018 | Refai-Ahmed | H01L 21/67333 |

* cited by examiner

APPARATUS FOR INSPECTION OF A PACKAGE ASSEMBLY WITH A THERMAL SOLUTION

FIELD

Embodiments of the present disclosure generally relate to the field of semiconductor package fabrication and in particular to inspection of semiconductor packages with thermal solutions.

BACKGROUND

The demands for thin bare-die ball grid array (BGA) packages, such as overall stack height reduction and electrical performance improvement have added complexity for thermal solution design, manufacturing, and assembly processes associated with microelectronic packages in computer manufacturing, e.g., in mobile computer systems.

Bare-die packages may include a thermal solution, which during the assembly process applies a load on the dice. This load may be required to achieve thermal performance as very low loads may lead to lower thermal performance. On the other hand, highly concentrated load may cause a die crack risk. The load exerted by the thermal solution is a characteristic of the thermal solution design and the assembly process. The interaction of the thermal solution with the bare-die package during the assembly process may be very critical, creating a need for an in-depth understanding of the impact of design and manufacturing on product quality and performance.

Current thermal solution designs use a thin cold plate, which may be susceptible to significant deflection, when subjected to an enabling load. A deflection or tilt of a cold plate may easily cause a concentrated load to apply to the dice or other substrate components (e.g., passive components, package stiffener, etc.), which may result in die damage, solder joint reliability or electrical shorts, as well as product performance impact due to degraded thermal contact between the dice and cold plate. Further, current thermal solution designs may be provided by third party manufacturers, who may not always adhere to thermal performance and mechanical pressure requirements of semiconductor package manufacturers.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure include techniques and configurations for inspection of a package assembly with a thermal solution, in accordance with some embodiments. In some embodiments, an apparatus for inspection of a package assembly with a thermal solution may include a first fixture to house the package assembly on the apparatus, and a second fixture to house at least a portion of a thermal solution that is to be disposed on top of the package assembly. The apparatus may further include a load actuator, to apply a load to a die of the package assembly, via the thermal solution, and a plurality of sensors disposed around the thermal solution and the package assembly, to perform in situ thermal and/or mechanical measurements associated with the application of the load to the die of the package assembly.

In the following detailed description, reference is made to the accompanying drawings that form a part hereof, wherein like numerals designate like parts throughout, and in which are shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical, electrical, or optical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Figure 1:
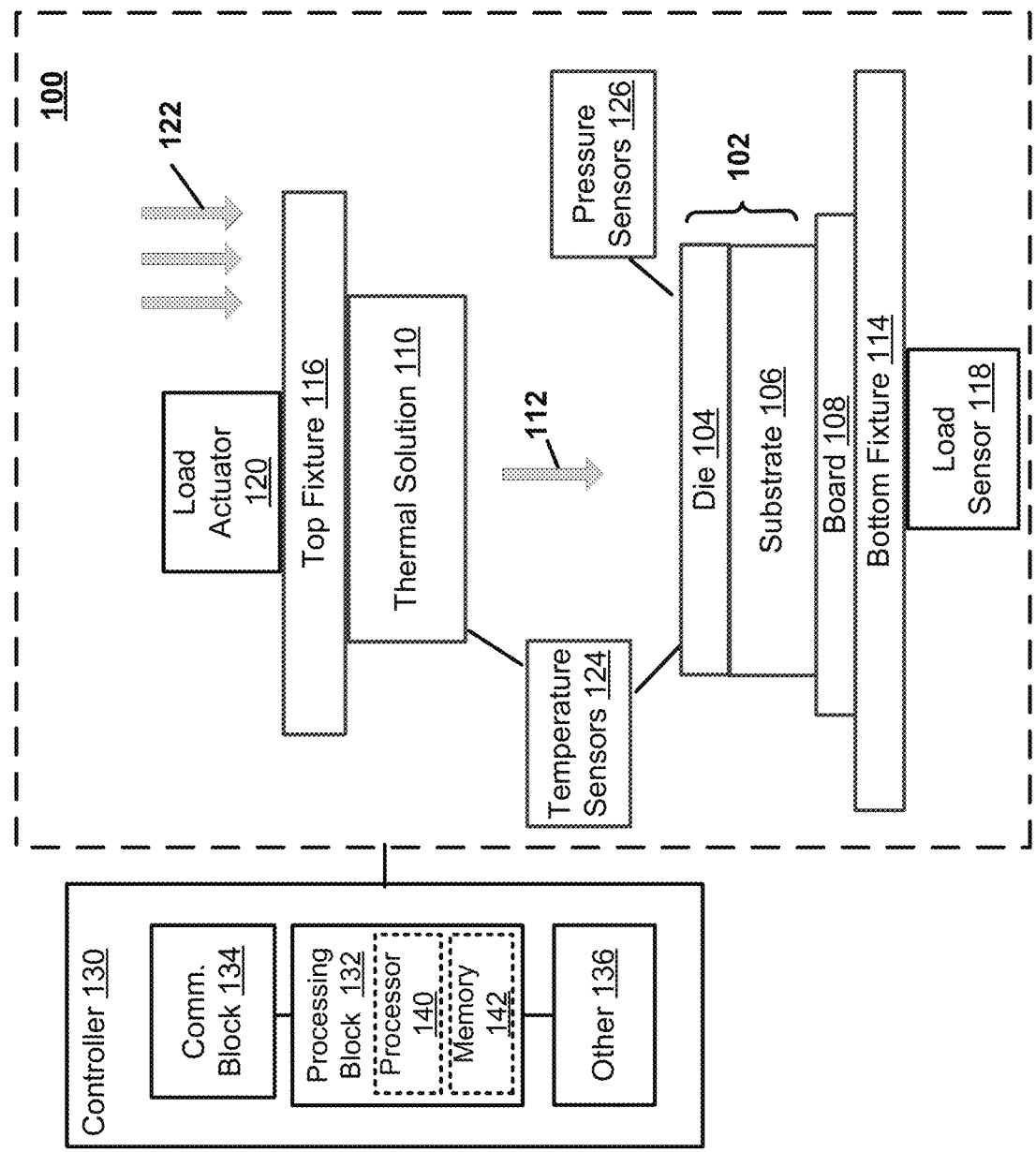
FIG. 1 schematically illustrates an example apparatus for inspection of a package assembly with a thermal solution, in accordance with some embodiments.

FIG. 1 schematically illustrates an example apparatus for inspection of a package assembly with a thermal solution, in accordance with some embodiments.

In some embodiments, a package assembly 102 to be inspected may comprise a semiconductor package device, for example an integrated circuit (IC), such as a central processing unit (CPU) or a memory unit, and may further comprise a portion of a computing device, such as a graphics device, wireless device, multi-chip package including a combination with other devices, or the like.

In some embodiments, the package assembly 102 may include one or more dies (hereinafter "die 104") electrically and/or physically coupled with a substrate 106 (sometimes referred to as a "package substrate"). In some embodiments, the package assembly 102 may be electrically coupled with a printed circuit board (PCB) 108.

The die 104 may represent a discrete product made from a semiconductor material (e.g., silicon) using semiconductor fabrication techniques such as thin film deposition, lithography, etching, and the like used in connection with forming complementary metal-oxide-semiconductor (CMOS) devices. In other embodiments, the die may be, include, or be a part of a processor, memory, system-on-chip (SoC), SiP, or ASIC. The die 104 may generally include a semiconductor substrate, one or more device layers, and one or more interconnect layers to provide electrical routing and/or contacts. In embodiments, the die 104 may comprise multiple dice in side by side configuration, or vertically stacked configuration, or both.

In some embodiments, an underfill material (not shown) may be disposed between the die 104 and the substrate 106 to promote adhesion and/or protect features of the die 104 and the substrate 106. The die 104 can be attached to the substrate 106 according to a wide variety of suitable configurations including, for example, being directly coupled with the substrate 106 in a flip-chip configuration.

The PCB 108 may be composed of an electrically insulative material such as an epoxy laminate. In some embodiments, the circuit board 122 may be a motherboard or other PCB in a computing device.

Package-level interconnects, such as solder balls (not shown), may be coupled with the package assembly 102 and/or the circuit board 108 to form corresponding solder joints that are configured to further route the electrical signals between the package assembly 102 and the PCB 108.

The package assembly 102 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. In embodiments, the package assembly 102 may comprise a bare-die multi-chip package.

In some embodiments, a thermal solution 110 may be disposed on the die 104 (e.g., on an inactive side of the die 104), during the package assembly process. The thermal solution 110 may provide heat dissipation for the package assembly 102. The thermal solution 110 may comprise, for example, a heat sink coupled with heat pipes and will be described below in greater detail.

During the assembly process, the thermal solution 110 may apply a load on the die 104, as indicated by arrow 112. This load may be required to achieve desired thermal performance of the package assembly 102. The load exerted by the thermal solution 110 on the die 104 is a characteristic of the thermal solution design and the assembly process. The embodiments of the apparatus 100 for inspection of a package assembly with a thermal solution described herein may provide the capability to perform in-situ thermal and mechanical measurements of the package with the thermal solution during assembly process, in order to achieve the optimum loading provided by the thermal solution 110 on the package assembly 102.

In embodiments, the apparatus 100 may include a bottom fixture 114, configured to receive and house the package assembly 102 and PCB 108. The apparatus 100 may further include a top fixture 116, configured to house the thermal solution 110. The top fixture 116 may be designed to accommodate various thermal solution designs in the apparatus 100. The entire fixture comprising top and bottom fixtures 116 and 114 (or at least the bottom fixture 114) may be coupled with (e.g., placed on) a load sensor 118. The load sensor 118 may comprise a load cell and configured to measure the load applied to the package assembly 102 during the assembly.

In embodiments, the apparatus 100 may further include a load actuator 120, to apply a load to the die 104 of the package assembly 102, via the thermal solution 110, as indicated by arrows 122. In embodiments, the apparatus 100 may be designed such that the actuator 120, thermal solution 110, and package assembly 102 are aligned with the loading center of the thermal solution 110.

In embodiments, the apparatus 100 may include a plurality of sensors disposed around the thermal solution 110 and the package assembly 102, to perform in situ thermal and/or mechanical measurements associated with the application of the load to the package assembly 102. The sensors may include temperature sensors 124 disposed around the thermal solution 110 and the top of the die 104, to measure temperatures of areas proximate to the die 104 and the thermal solution 110 during the application of the load to the die 104. In embodiments, the temperature sensors 124 may comprise thermocouples or resistance temperature detectors (RTDs).

The sensors may further include pressure sensors 126 that may be disposed on top of the package assembly 102, to measure pressure on the die 104 and the substrate 106 provided by the load during the application of the load to the package assembly 102. The pressure sensors 126 may comprise piezoelectric sensors, for example and may be provided in a thin film on top of the die 104, as described below. In some embodiments, the pressure sensors 126 may be embedded with the die 104 or the substrate 106, which may comprise piezoelectric elements.

In embodiments, the apparatus 100 may be operated by a computing device. In some embodiments, the computing device (e.g., a controller 130) may be communicatively coupled with the apparatus 100, as shown in FIG. 1. In some embodiments, the computing device (controller 130) may be embedded with the apparatus 100.

In embodiments, the controller 130 may be coupled with and configured to operate the load actuator 120, to control the load application to the die. The controller 130 may be coupled with the sensors 124, 126, and 118, and may be configured to receive and record (store) the thermal and/or mechanical measurements provided by the sensors, for further processing.

In embodiments, the controller 130 may comprise a processing block 132, to control the apparatus 100, and communication block 134, to communicate data associated with thermal and/or mechanical measurements provided by the apparatus 100.

The processing block 132 may comprise at least a processor 140 and memory 142. The processing block 132 may include components configured to control the apparatus 100 and store and process the readings provided by sensors 124, 126, and 118. The processing block 132 may provide these components through, for example, a plurality of machine-readable instructions stored in the memory 142 and executable on the processor 140. For example, the processing block 132 may execute a control program for load application and package inspection in accordance with embodiments described herein.

The processor 140 may include, for example, one or more processors situated in separate components, or alternatively one or more processing cores embodied in a component (e.g., in a System-on-a-Chip (SoC) configuration), and any processor-related support circuitry (e.g., bridging interfaces, etc.). Example processors may include, but are not limited to, various microprocessors including those in the Pentium®, Xeon®, Itanium®, Celeron®, Atom®, Quark®, Core® product families, or the like.

Examples of support circuitry may include host side or input/output (I/O) side chipsets (also known as northbridge and southbridge chipsets/components) to provide an interface through which the processor 140 may interact with other system components that may be operating at different speeds, on different buses, etc. in the controller 130. Some or all of the functionality commonly associated with the support circuitry may also be included in the same physical package as the processor.

The memory 142 may comprise random access memory (RAM) or read-only memory (ROM) in a fixed or removable format. RAM may include volatile memory configured to hold information during the operation of controller 130 such as, for example, static RAM (SRAM) or Dynamic RAM (DRAM). ROM may include non-volatile (NV) memory circuitry configured based on basic input/output system (BIOS), Unified Extensible Firmware Interface (UEFI), etc. to provide instructions when the controller 130 is activated, programmable memories such as electronic programmable ROMs (erasable programmable read-only memory), Flash, etc. Other fixed/removable memory may include, but is not limited to, electronic memories such as solid state flash memory, removable memory cards or sticks, etc.

The communication block 134 may include one or more radios capable of transmitting and receiving signals using various suitable wireless communications techniques.

The controller 130 may include other components 136 that may be necessary for functioning of the apparatus 100. Other components 136 may include, for example, hardware and/or software to allow users to interact with the controller 130 and with apparatus 100 such as, for example, various input mechanisms (e.g., microphones, switches, buttons, knobs, keyboards, speakers, touch-sensitive surfaces, etc.) and various output mechanisms (e.g., speakers, displays, lighted/flashing indicators, etc.). The hardware in other components 136 may be incorporated within the controller 130 and/or apparatus 100 and/or may be coupled to the controller 130 via a wired or wireless communication medium.

Figure 2:
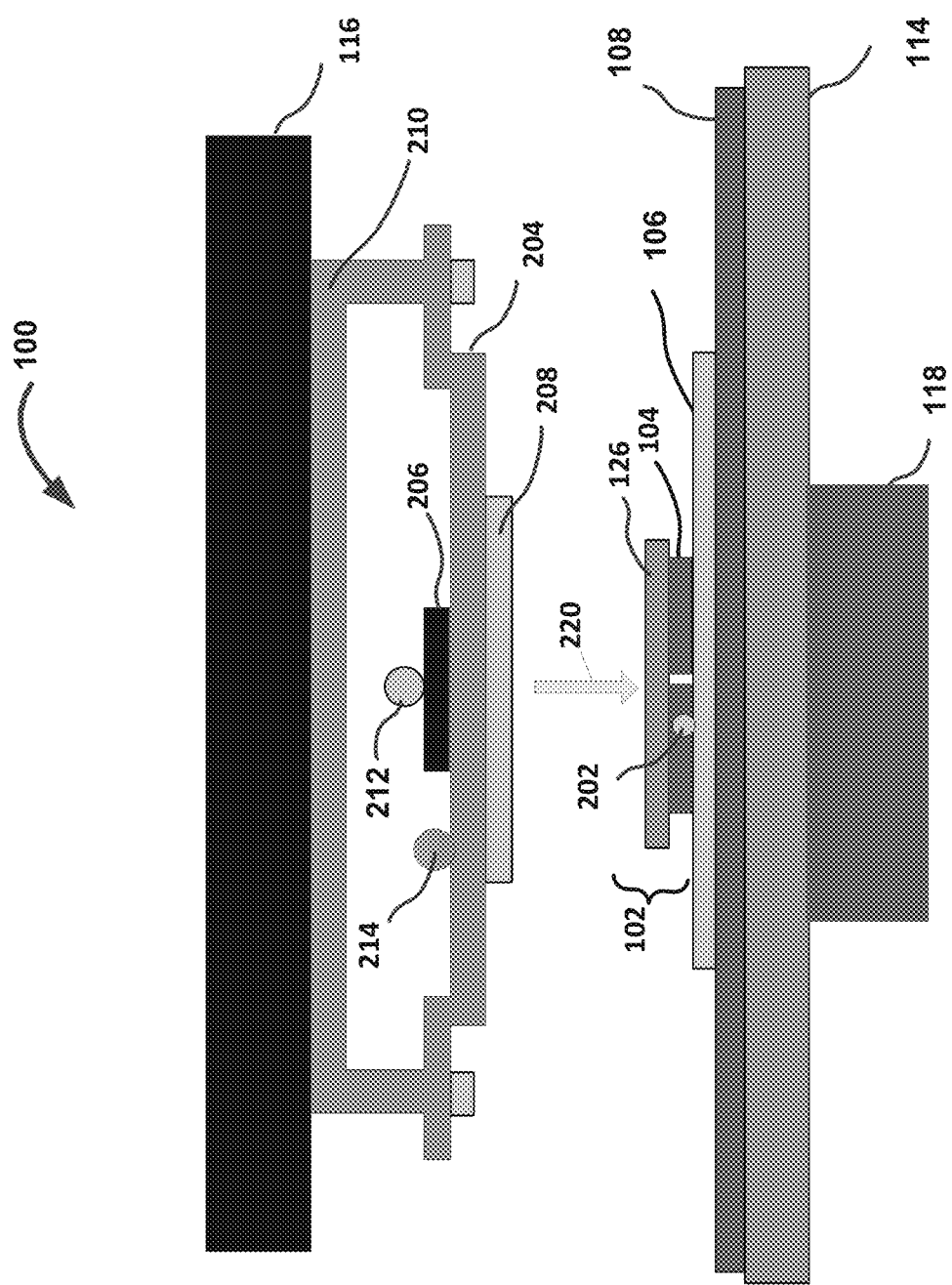
FIG. 2 illustrates some aspects of the example apparatus of FIG. 1, in accordance with some embodiments.

FIG. 2 illustrates some aspects of the example apparatus of FIG. 1, in accordance with some embodiments. For ease of understanding, like components of FIGS. 1 and 2 are identified by like numerals.

A shown, the bottom fixture 114 of the apparatus 100 may comprise a bottom plate, on which the PCB 108 with attached package assembly (die 104 and substrate 106) may reside. The bottom plate (fixture 114) may rest on the load sensor (cell) 118 to capture the load applied by the thermal solution 110 on the package assembly 102.

The temperature sensors (e.g., thermocouple 202) may be placed on or adjacent to the die 104. The pressure sensors 126 may be film-type pressure sensors and may be disposed on top of the die 104, as shown. In some embodiments, the pressure sensors 126 may be integrated at the silicone (e.g., frontend or backend of the die 104), which may allow for simultaneous thermal and pressure managements.

The thermal solution 110 may include a cold plate (heat spreader plate (HSP)) 204 with a heat pipe 206 disposed on the HSP 204. Thermal interface material (TIM) 208 may be disposed on the side (e.g., bottom side) of the HSP 204 that faces the die 104, to provide heat dissipation for the die 104. The thermal solution 110 (or, in some embodiments, the apparatus 100) may further include a backing plate 210 attached to the HSP 204. As shown, the thermal solution 110 may be mounted on the top fixture 116, which may comprise a top plate. For example, the HSP 204 may be coupled with the top plate 116 via the backing plate 210. The thermal solution 110 may further include a heat sink (not shown in FIG. 2) coupled with the heat pipe 206. The temperature sensors (thermocouples 212, 214) may be placed on the HSP 204 and the heat pipe 206, to capture the effect of loading on the thermal performance of the package assembly 102. For example, the thermocouples 214 may be placed on a top surface of the heat pipe 206, to capture the heat pipe temperature (THP).

For the in-situ thermal measurements, the thermal solution 110 may be mounted on the top fixture 116 after the application of TIM 208 to the HSP 204, as shown in FIG. 2. A load (e.g., 0.3 lb) may be applied to the thermal solution 110 using the load actuator 120 (FIG. 1). The load may be transferred on the die 104 by the thermal solution 110. When the load is applied, the load actuator 120 may push the top fixture 102 down (as indicated by arrow 220) and the thermal solution 110 and TIM 208 may apply the load on the die 104. After the application of this load, the die 104 may be powered on. Steady state thermal measurements of the die temperature Tj and heat pipe temperature THP may be recorded by the controller 130 (FIG. 1) at each load step and a constant power (e.g., 15 W) is applied to the die throughout. After the thermal measurements are completed at one load step, the load may be increased incrementally in a stepped manner (e.g., 1 lb) and the thermal parameters (e.g., Tj and THP) may be recorded for calculating the junction-to-heat pipe thermal resistance Rj-HP. This parameter indicates the quality of the thermal solution/heat pipe design and its attachment on the die. Rj-HP may be calculated using equation 1:

$$Rj\text{-}HP = (Tj - THP)/Q \qquad (1)$$

where Q is power supplied to the die.

Pressure measurements may be carried out using a thin film pressure sensors 126 with the same load application increments as for in-situ thermal measurements. The additional step for the pressure measurement process (vis-à-vis the thermal measurement process) may be a placement of the pressure sensor 126 on the die 104. The pressure sensor 126 may be placed on top of the package 102 (e.g., die 104) and may remain in a fixed position throughout the in-situ pressure measurements. During the pressure measurements, the same types of TIM, package, thermal solution and load range may be used as for thermal measurements. The difference between the thermal measurement and pressure measurement may be that the die may be powered off during pressure measurements. Accordingly, the apparatus 100 may capture the enabling load impact on the package separately for thermal and mechanical (pressure) measurements.

In some embodiments, when the pressure sensor 126 may be integrated at the silicon of the die 104 or at the substrate 106, thermal and pressure managements may be performed simultaneously, when the die 104 is powered on.

Figure 3:
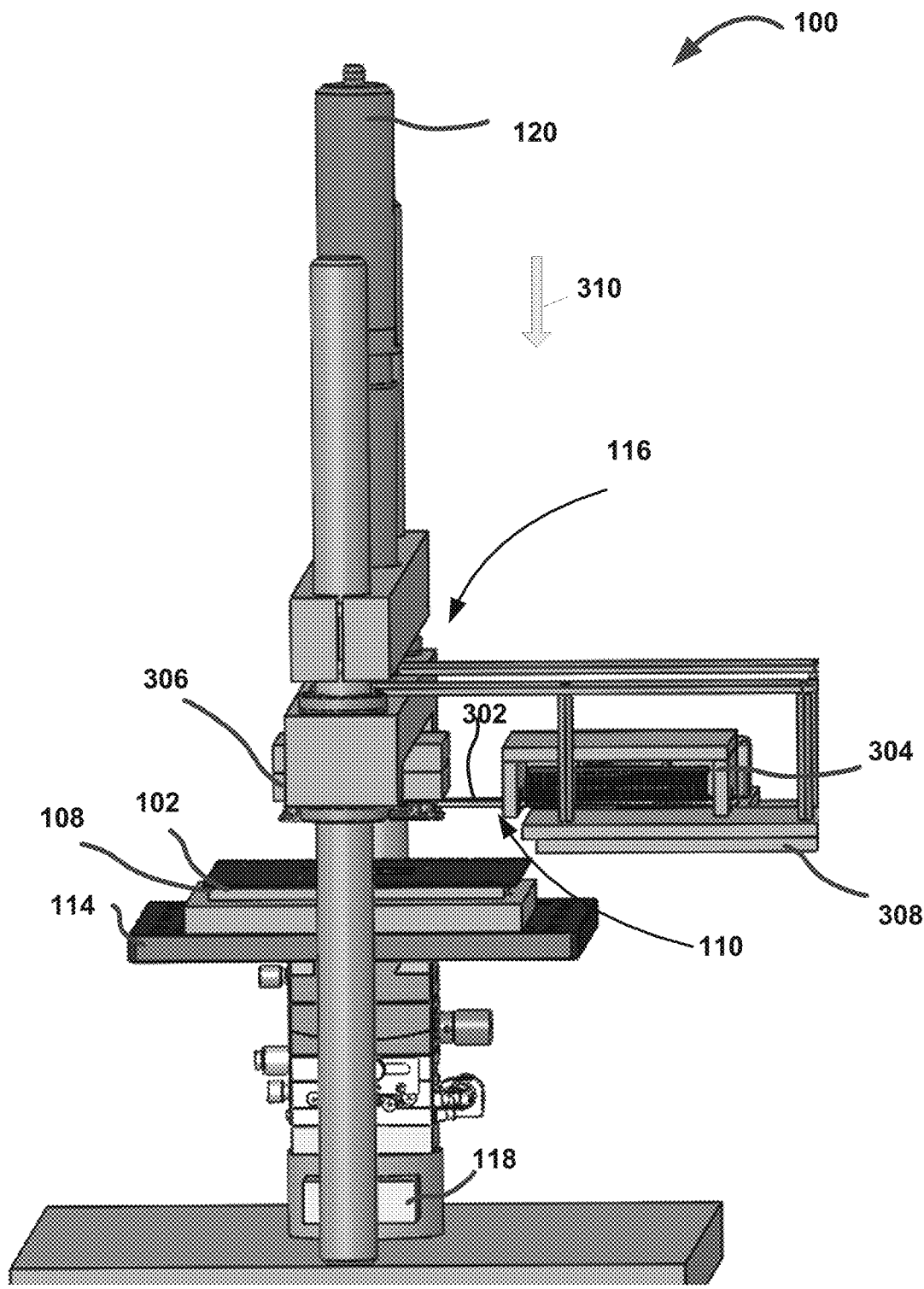
FIGS. 3-5 illustrate some aspects of a setup of an example apparatus for inspection of a package assembly with a thermal solution, in accordance with some embodiments.
Figure 4:
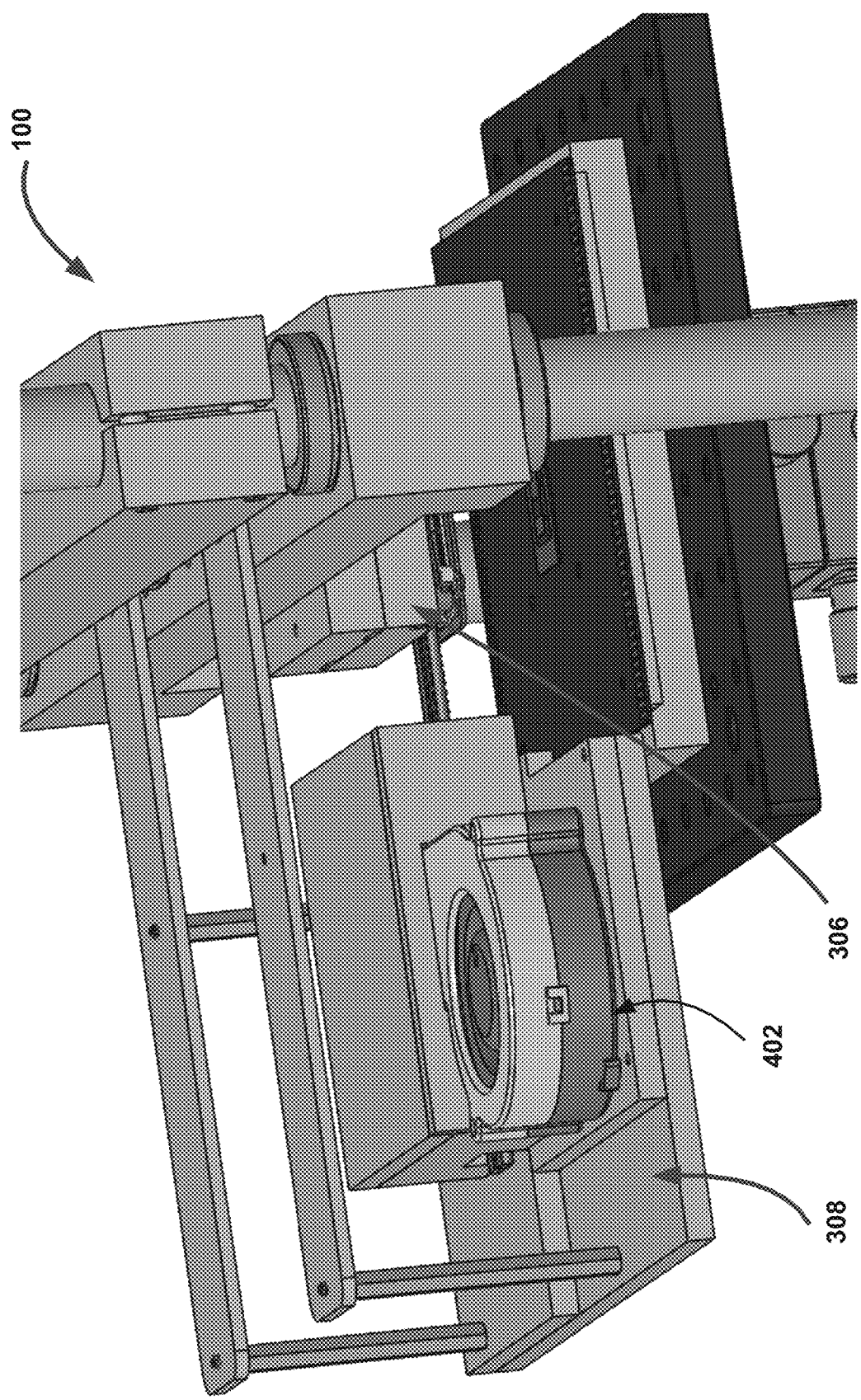
Figure 5:
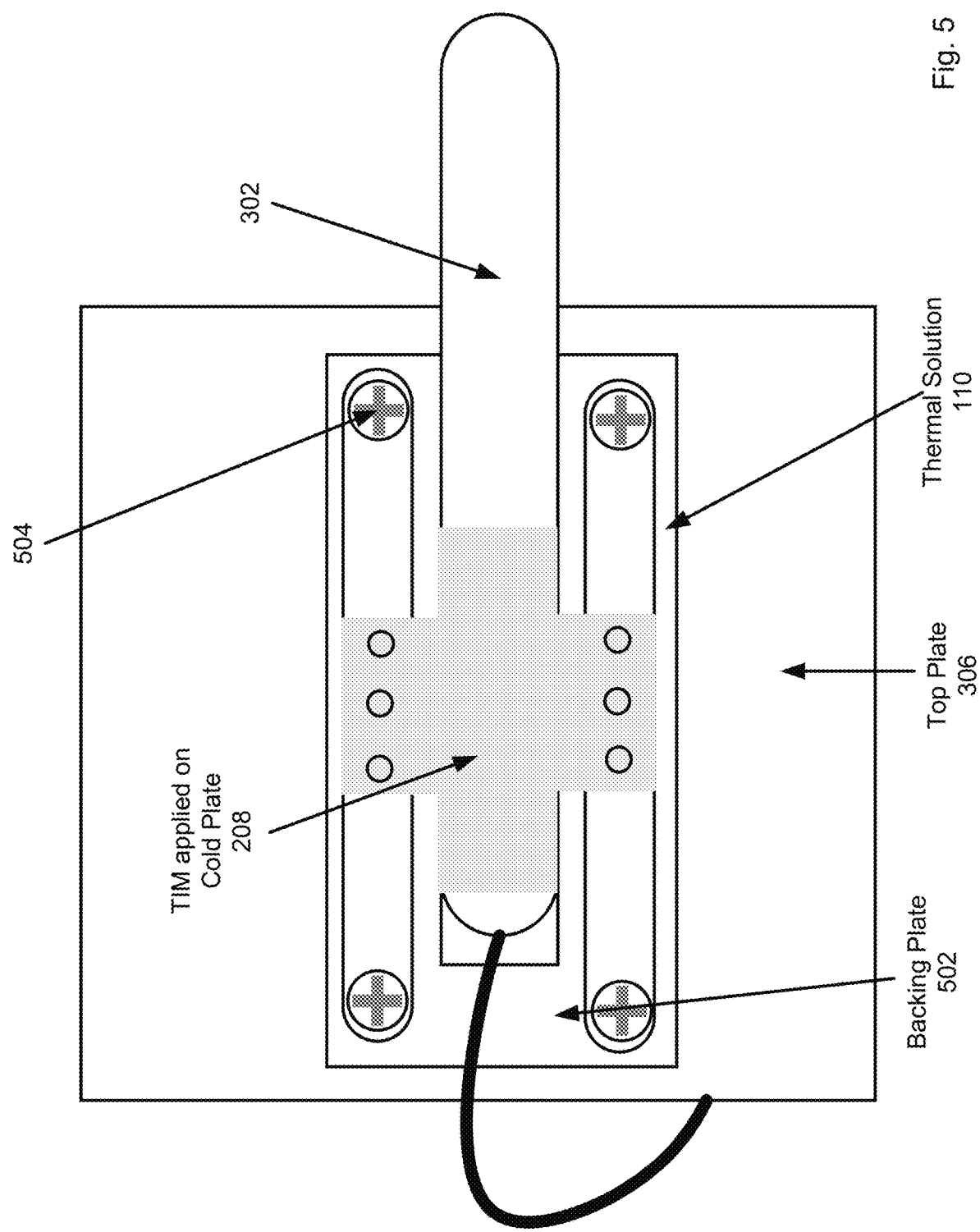

FIGS. 3-5 illustrate some aspects of a setup of an example apparatus for inspection of a package assembly with a thermal solution, in accordance with some embodiments. For ease of understanding, like components of FIGS. 1-2 and 3-5 are identified by like numerals.

FIG. 3 illustrates a side view of an example setup of the apparatus for inspection of a package assembly with a thermal solution, in accordance with some embodiments. As shown, the package assembly 102 with the PCB 108 may be disposed on the bottom fixture (plate) 114. As shown, the PCB 108 may be placed on the bottom fixture 114. The load sensor (load cell) 118 may be disposed underneath the bottom fixture 114, to measure the load applied to the package assembly 102. As shown, the bottom fixture (plate) 114 may be fixed on the load cell 118. Accordingly, the PCB 108 may rest flat on a fixed support and hence may prevent any bending or tilting of the package assembly 102 during the in-situ thermal and mechanical measurements.

The thermal solution 110 may comprise a heat pipe 302 coupled with a heat sink 304. As shown, the thermal solution 110 may be disposed on the top fixture 116, which may include a top plate 306. To provide further support for the thermal solution, the top fixture 116 may also include a platform 308 to house at least a portion of a thermal solution 110, such as the heat sink 304.

The load actuator 120 may be operated by a controller (e.g., controller 130 of FIG. 1) to apply a load to the package assembly 102, via the thermal solution 110, as indicated by an arrow 310.

The embodiments described herein may provide for thermal and mechanical measurements related to different kinds of thermal solutions, such as thermal solutions applied in laptop computers, desktop computers, servers, workstations, mobile devices, or other types of devices.

FIG. 4 illustrates a perspective view of a portion of an example setup of the apparatus for inspection of a package assembly with a thermal solution, in accordance with some embodiments. More specifically, the portion of the apparatus 100 shown in FIG. 4 may provide for a disposition of thermal solutions of different types. For example, the apparatus 100 may be provided for a disposition of a thermal solution 402, which may comprise a thermal solution for laptop computers. Accordingly, the top fixture 116 comprising the top plate 306 with the platform 308 may provide for disposition of thermal solutions applicable to different computing devices.

FIG. 5 illustrates a bottom view of a portion of an example setup of the apparatus for inspection of a package assembly with a thermal solution, in accordance with some embodiments. As shown, the thermal solution 110 with TIM 208 applied on it may be mounted on the top plate 306 of the top fixture 116 with the help of a backing plate 502 and screws 504 designed for the specific thermal solution being evaluated. As shown, the thermal solution 110 may include the heat pipe 302, which may be coupled with a heat sink (not shown).

Figure 6:
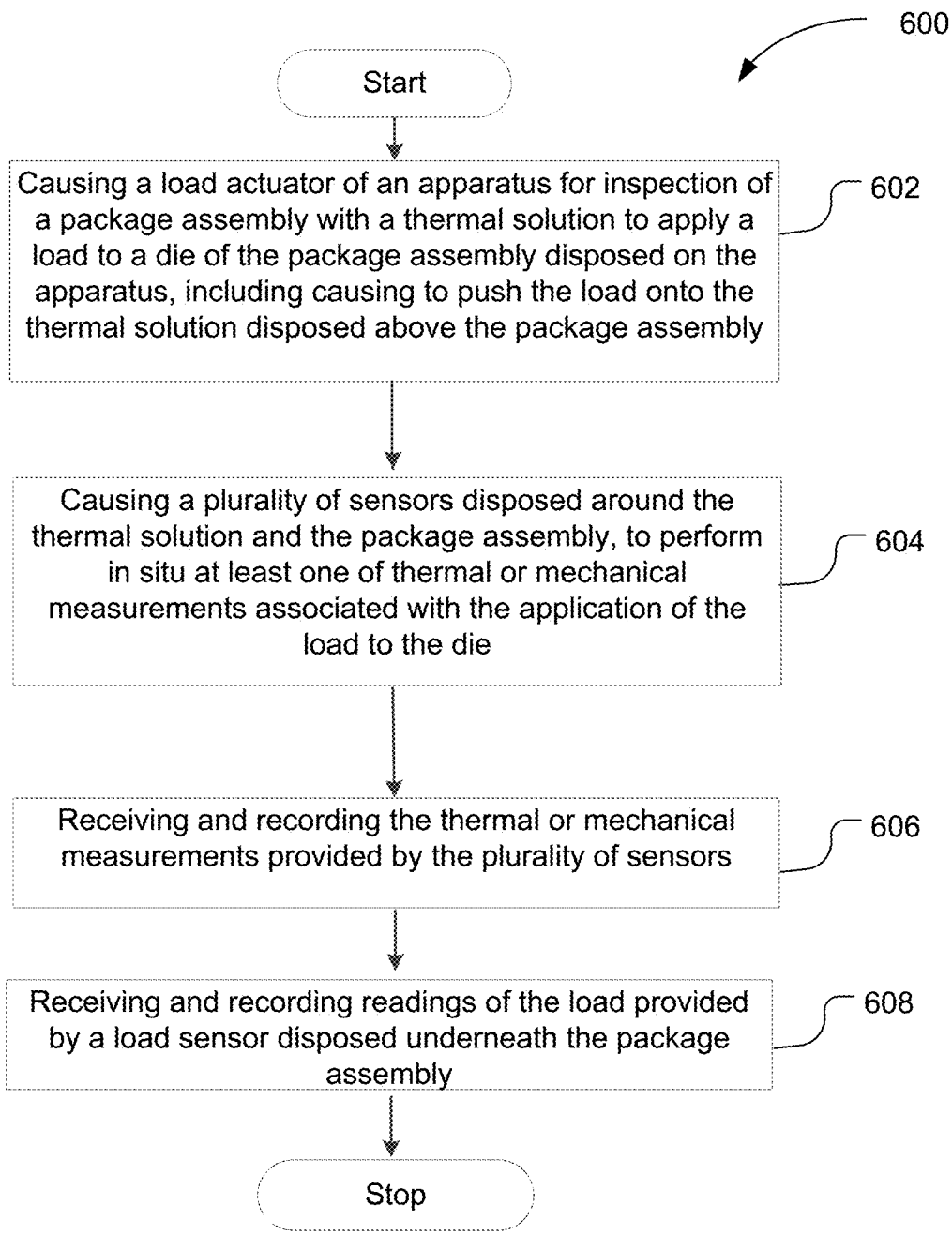
FIG. 6 is an example process flow diagram for inspecting a package assembly with a thermal solution, in accordance with some embodiments.

FIG. 6 is an example process flow diagram for inspecting a package assembly with a thermal solution, in accordance with some embodiments. The process 600 may comport with embodiments described in reference to FIGS. 1-5 of this disclosure. In some embodiments, the process 600 may be performed by a controller, such as the controller 130 of FIG. 1.

The process 600 may begin at block 602 and include causing a load actuator of the apparatus for inspection of a package assembly with a thermal solution to apply a load to a die of the package assembly disposed on the apparatus, including causing to push the load onto the thermal solution disposed above the package assembly. The thermal solution is to be disposed on top of the die.

At block 604, the process 600 may include causing a plurality of sensors disposed around the thermal solution and the package assembly, to perform in situ at least one of thermal or mechanical measurements associated with the application of the load to the die.

In some embodiments, the performance of in situ measurements may include powering on the die, initiating the thermal measurements by some of the plurality of sensors (e.g., temperature sensors), and receiving and recording the thermal measurements.

In some embodiments, the performance of in situ measurements may include powering off the die, initiating the mechanical measurements by some of the plurality of sensors (e.g., pressure sensors), and receiving and recording the mechanical measurements.

In some embodiments, the performance of in situ measurements may include powering on the die, causing the plurality of sensors to initiate the mechanical and thermal measurements, and receiving and recording the mechanical and thermal measurements.

At block 606, the process 600 may include receiving and recording the thermal or mechanical measurements provided by the plurality of sensors, for further processing.

At block 608, the process 600 may include receiving and recording readings of the load provided by a load sensor disposed underneath the package assembly.

In embodiments, the process 600 may return to block 602, at which the load may be incrementally increased, and the actions of blocks 604, 606, and 606 repeated. The incremental increase or the load and subsequent measurements may occur in multiple cycles, until a desired number of measurements has been provided.

The embodiments described herein may be further illustrated by the following examples.

Example 1 may be an apparatus for inspection of a package assembly with a thermal solution, comprising: a first fixture to house the package assembly on the apparatus; a second fixture to house at least a portion of a thermal solution that is to be disposed on top of the package assembly; a load actuator, to apply a load to a die of the package assembly, via the thermal solution; and a plurality of sensors disposed around the thermal solution and the package assembly, to perform in situ at least one of thermal or mechanical measurements associated with the application of the load to the die of the package assembly.

Example 2 may include the apparatus of example 1, wherein the plurality of sensors includes: a plurality of temperature sensors disposed around the thermal solution and the top of the die, to measure temperatures of a first area proximate to the die and a second area proximate to the thermal solution during the application of the load to the die; one or more pressure sensors disposed on top of the die, to measure pressure on the die provided by the load during the application of the load to the die; and a load sensor disposed underneath the package assembly, to measure the load during the application of the load to the die.

Example 3 may include the apparatus of example 1, wherein the pressure sensors comprise piezoelectric sensors, wherein the load sensor comprises a load cell, and wherein the plurality of temperature sensors comprise one or more thermocouples.

Example 4 may include the apparatus of example 2, further comprising a controller coupled with the load actuator and the plurality of sensors, to: operate the load actuator, to control the load application to the die; and receive and record the at least one of the thermal or mechanical measurements provided by the plurality of sensors, for further processing.

Example 5 may include the apparatus of example 4, wherein the thermal solution includes: a heat spreader; a thermal interface material (TIM) disposed on a side of the heat spreader that faces the die; a heat pipe disposed on the heat spreader; and a heat sink coupled with the heat pipe, wherein at least the heat sink is disposed on the platform, wherein at least one of the plurality of temperature sensors is disposed around the heat pipe.

Example 6 may include the apparatus of example 5, wherein the first fixture comprises a first plate, wherein the second fixture comprises a second plate, wherein the second plate is disposed above the first plate and is coupled with a platform, wherein the heat sink is mounted on the platform, and wherein the heat spreader is coupled with the second plate via a backing plate.

Example 7 may include the apparatus of example 6, wherein the controller to operate the actuator includes to cause the second plate to push down to apply the load to the die in a stepped manner, wherein the controller is further to: power off the die; cause at least some of the plurality of sensors to initiate the mechanical measurements; record the mechanical measurements, wherein the mechanical measurements include readings provided by one or more pressure sensors disposed on top of the die; and receive and record readings of the load provided by the load sensor.

Example 8 may include the apparatus of example 6, wherein the controller to operate the actuator includes to cause the second plate to push down to apply the load to the die in a stepped manner, wherein the controller is further to: power on the die; cause at least some of the plurality of sensors to initiate the thermal measurements; record the thermal measurements; and receive and record readings of the load provided by the load sensor.

Example 9 may include the apparatus of example 6, wherein the controller to operate the actuator includes to cause the second plate to push down to apply the load to the die in a stepped manner, wherein the controller is further to: power on the die; cause the plurality of sensors to initiate the thermal and mechanical measurements; record the thermal and mechanical measurements; and receive and record readings of the load provided by the load sensor.

Example 10 may include the apparatus of any examples 1 to 9, wherein the package assembly includes: a substrate, wherein the die is disposed on the substrate; and a printed circuit board (PCB), wherein the substrate is disposed on the PCB, and wherein the PCB is disposed on the plate.

Example 11 may include the apparatus of example 10, wherein the PCB comprises a motherboard, and the die comprises a central processing unit (CPU).

Example 12 may be a method, comprising: causing, by a controller coupled with an apparatus for inspection of a package assembly with a thermal solution, a load actuator of the apparatus to apply a load to a die of the package assembly disposed on the apparatus, wherein causing to apply the load includes causing to push the load onto the thermal solution that is disposed above the package assembly, and is to be disposed on top of the die; causing, by the controller, a plurality of sensors disposed around the thermal solution and the package assembly, to perform in situ at least one of thermal or mechanical measurements associated with the application of the load to the die; and receiving and storing, by the controller, the at least one of the thermal or mechanical measurements provided by the plurality of sensors, for further processing.

Example 13 may include the method of example 12, wherein causing a plurality of sensors disposed around the thermal solution and the package assembly to perform in situ at least one of thermal or mechanical measurements includes: powering on the die, by the controller; causing, by the controller, the plurality of sensors to initiate the thermal measurements; and receiving and recording, by the controller, the thermal measurements; or powering off the die, by the controller; causing, by the controller, the plurality of sensors to initiate the mechanical measurements; and receiving and recording, by the controller, the mechanical measurements, including readings provided by one or more pressure sensors disposed on top of the die.

Example 14 may include the method of example 12, wherein causing a plurality of sensors disposed around the thermal solution and the package assembly to perform in situ at least one of thermal or mechanical measurements includes: powering on the die, by the controller; causing, by the controller, the plurality of sensors to initiate the mechanical and thermal measurements; and receiving and recording, by the controller, the mechanical and thermal measurements.

Example 15 may include the method of example 12, further comprising: receiving and recording, by the controller, readings of the load provided by a load sensor disposed underneath the package assembly.

Example 16 may include the method of example of any of examples 12 to 15, wherein causing a load actuator of the apparatus to apply a load to a die of the package assembly includes operating, by the controller, the load actuator to increase the load to the die in a stepped manner.

Example 17 may be a system for inspection of a package assembly with a thermal solution, comprising: a first fixture to house the package assembly; a second fixture disposed above the first fixture, to house the thermal solution; a load actuator coupled with the second fixture to move the second fixture toward the first fixture, to provide a contact between the thermal solution and the package assembly, to apply a load to a die of the package assembly; a plurality of sensors disposed around the thermal solution and the package assembly, to perform in situ at least one of thermal or mechanical measurements associated with the application of the load to the die; and a controller coupled with the load actuator and the plurality of sensors, to operate the actuator, and receive and record the at least one of the thermal or mechanical measurements provided by the plurality of sensors, for further processing.

Example 18 may include the system of example 17, wherein the plurality of sensors includes: a plurality of temperature sensors disposed around the thermal solution and the top of the die, to measure temperatures of a first area proximate to the die and a second area proximate to the thermal solution during the application of the load to the die; one or more pressure sensors disposed on top of the die, to measure pressure on the die provided by the load during the application of the load to the die; and a load sensor disposed underneath the package assembly, to measure the load during the application of the load to the die.

Example 19 may include the system of example 18, wherein the thermal solution includes: a heat spreader; a thermal interface material (TIM) disposed on a side of the heat spreader that faces the die; a heat pipe disposed on the heat spreader; and a heat sink coupled with the heat pipe, wherein at least the heat sink is disposed on the platform, wherein at least one of the plurality of temperature sensors is disposed around the heat pipe.

Example 20 may include the system of example 19, wherein the heat spreader is coupled with the second fixture via a backing plate.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. An apparatus for inspection of a package assembly with a thermal solution, comprising:
    a first fixture to house the package assembly on the apparatus;
    a second fixture to house at least a portion of a thermal solution that is to be disposed on top of the package assembly;
    a load actuator, to apply a load to a die of the package assembly, via the thermal solution; and
    a plurality of sensors disposed around the thermal solution and the package assembly, to perform in situ at least one of thermal or mechanical measurements associated with the application of the load to the die of the package assembly,
    wherein the package assembly includes a substrate, wherein the die is disposed on the substrate; and a printed circuit board (PCB), wherein the substrate is disposed on the PCB, and wherein the PCB is disposed on the first fixture.

2. The apparatus of claim 1, wherein the plurality of sensors includes:
    a plurality of temperature sensors disposed around the thermal solution and the top of the die, to measure temperatures of a first area proximate to the die and a second area proximate to the thermal solution during the application of the load to the die;
    one or more pressure sensors disposed on top of the die, to measure pressure on the die provided by the load during the application of the load to the die; and
    a load sensor disposed underneath the package assembly, to measure the load during the application of the load to the die.

3. The apparatus of claim 2, wherein the pressure sensors comprise piezoelectric sensors, wherein the load sensor comprises a load cell, and wherein the plurality of temperature sensors comprise one or more thermocouples.

4. The apparatus of claim 2, further comprising a controller coupled with the load actuator and the plurality of sensors, to:
    operate the load actuator, to control the load application to the die; and
    receive and record the at least one of the thermal or mechanical measurements provided by the plurality of sensors, for further processing.

5. The apparatus of claim 4, wherein the thermal solution includes:
    a heat spreader;
    a thermal interface material (TIM) disposed on a side of the heat spreader that faces the die;
    a heat pipe disposed on the heat spreader; and
    a heat sink coupled with the heat pipe, wherein at least the heat sink is disposed on a platform,
    wherein at least one of the plurality of temperature sensors is disposed around the heat pipe.

6. The apparatus of claim 5, wherein the first fixture comprises a first plate, wherein the second fixture comprises a second plate, wherein the second plate is disposed above the first plate and is coupled with a platform, wherein the heat sink is mounted on the platform, and wherein the heat spreader is coupled with the second plate via a backing plate.

7. The apparatus of claim 6, wherein the controller to operate the actuator includes to cause the second plate to push down to apply the load to the die in a stepped manner, wherein the controller is further to:
    power off the die;
    cause at least some of the plurality of sensors to initiate the mechanical measurements;
    record the mechanical measurements, wherein the mechanical measurements include readings provided by one or more pressure sensors disposed on top of the die; and
    receive and record readings of the load provided by the load sensor.

8. The apparatus of claim 6, wherein the controller to operate the actuator includes to cause the second plate to push down to apply the load to the die in a stepped manner, wherein the controller is further to:
    power on the die;
    cause at least some of the plurality of sensors to initiate the thermal measurements;
    record the thermal measurements; and
    receive and record readings of the load provided by the load sensor.

9. The apparatus of claim 6, wherein the controller to operate the actuator includes to cause the second plate to push down to apply the load to the die in a stepped manner, wherein the controller is further to:
    power on the die;
    cause the plurality of sensors to initiate the thermal and mechanical measurements;
    record the thermal and mechanical measurements; and
    receive and record readings of the load provided by the load sensor.

10. The apparatus of claim 1, wherein the PCB comprises a motherboard, and the die comprises a central processing unit (CPU).

11. A method, comprising:
    causing, by a controller coupled with an apparatus for inspection of a package assembly with a thermal solution, a load actuator of the apparatus to apply a load to a die of the package assembly disposed on the apparatus, wherein causing to apply the load includes causing to push the load onto the thermal solution that is disposed above the package assembly, and is to be disposed on top of the die, and operating the load actuator to increase the load to the die in a stepped manner;
    causing, by the controller, a plurality of sensors disposed around the thermal solution and the package assembly, to perform in situ at least one of thermal or mechanical measurements associated with the application of the load to the die; and
    receiving and storing, by the controller, the at least one of the thermal or mechanical measurements provided by the plurality of sensors, for further processing.

12. The method of claim 11, wherein causing a plurality of sensors disposed around the thermal solution and the package assembly to perform in situ at least one of thermal or mechanical measurements includes:
    powering on the die, by the controller;
    causing, by the controller, the plurality of sensors to initiate the thermal measurements; and receiving and recording, by the controller, the thermal measurements; or powering off the die, by the controller;

causing, by the controller, the plurality of sensors to initiate the mechanical measurements; and receiving and recording, by the controller, the mechanical measurements, including readings provided by one or more pressure sensors disposed on top of the die.

13. The method of claim 11, wherein causing a plurality of sensors disposed around the thermal solution and the package assembly to perform in situ at least one of thermal or mechanical measurements includes:

powering on the die, by the controller;

causing, by the controller, the plurality of sensors to initiate the mechanical and thermal measurements; and receiving and recording, by the controller, the mechanical and thermal measurements.

14. The method of claim 11, further comprising: receiving and recording, by the controller, readings of the load provided by a load sensor disposed underneath the package assembly.

15. A system for inspection of a package assembly with a thermal solution, comprising:

a first fixture to house the package assembly;

a second fixture disposed above the first fixture, to house the thermal solution;

a load actuator coupled with the second fixture to move the second fixture toward the first fixture, to provide a contact between the thermal solution and the package assembly, to apply a load to a die of the package assembly;

a plurality of sensors disposed around the thermal solution and the package assembly, to perform in situ at least one of thermal or mechanical measurements associated with the application of the load to the die, wherein the plurality of sensors includes:

a plurality of temperature sensors disposed around the thermal solution and the top of the die, to measure temperatures of a first area proximate to the die and a second area proximate to the thermal solution during the application of the load to the die; one or more pressure sensors disposed on top of the die, to measure pressure on the die provided by the load during the application of the load to the die; and a load sensor disposed underneath the package assembly, to measure the load during the application of the load to the die; and a controller coupled with the load actuator and the plurality of sensors, to operate the actuator, and receive and record the at least one of the thermal or mechanical measurements provided by the plurality of sensors, for further processing.

16. The system of claim 15, wherein the thermal solution includes:

a heat spreader;

a thermal interface material (TIM) disposed on a side of the heat spreader that faces the die;

a heat pipe disposed on the heat spreader; and a heat sink coupled with the heat pipe, wherein at least the heat sink is disposed on a platform, wherein at least one of the plurality of temperature sensors is disposed around the heat pipe.

17. The system of claim 16, wherein the heat spreader is coupled with the second fixture via a backing plate.

* * * * *